United States Patent [19]

Copeland et al.

[11] Patent Number: 4,575,233

[45] Date of Patent: Mar. 11, 1986

[54] PHOTOGRAPHIC PRINTING

[75] Inventors: Harry J. Copeland, Springfield; John W. Powers, Battlefield, both of Mo.

[73] Assignee: Western Litho Plate & Supply Co., Springfield, Mo.

[21] Appl. No.: 710,425

[22] Filed: Mar. 11, 1985

Related U.S. Application Data

[63] Continuation-in-part of Ser. No. 602,337, Apr. 20, 1984.

[51] Int. Cl.$^4$ .................. G03B 27/04; G03B 27/20
[52] U.S. Cl. ........................................ 355/85; 355/91
[58] Field of Search ............... 355/26, 18, 91, 99, 355/53, 72, 85

[56] References Cited

U.S. PATENT DOCUMENTS

| | | | |
|---|---|---|---|
| 3,635,559 | 1/1972 | Harrell et al. | 355/91 X |
| 3,810,694 | 5/1974 | Harrell et al. | 355/53 X |
| 4,353,647 | 10/1982 | Harrell et al. | 355/91 |
| 4,423,955 | 1/1984 | Powers | 355/99 |

*Primary Examiner*—Richard A. Wintercorn
*Attorney, Agent, or Firm*—Senniger, Powers, Leavitt and Roedel

[57] ABSTRACT

An apparatus for exposing boards which are photosensitive on both sides, for production of printed circuits on both sides, to light through films on both sides in which a lower film, a board, and an upper film in registered position on a light-transmitting platen are pressed down by a window and exposed to light on both sides through the platen and window. A pair of registration pins are adjustably positioned in spaced relation along an edge of the platen and corresponding holes in the boards are used to align the boards and films for exposure. The pins are spaced as widely apart as possible to provide maximum registration between boards of varying sizes and films.

9 Claims, 15 Drawing Figures

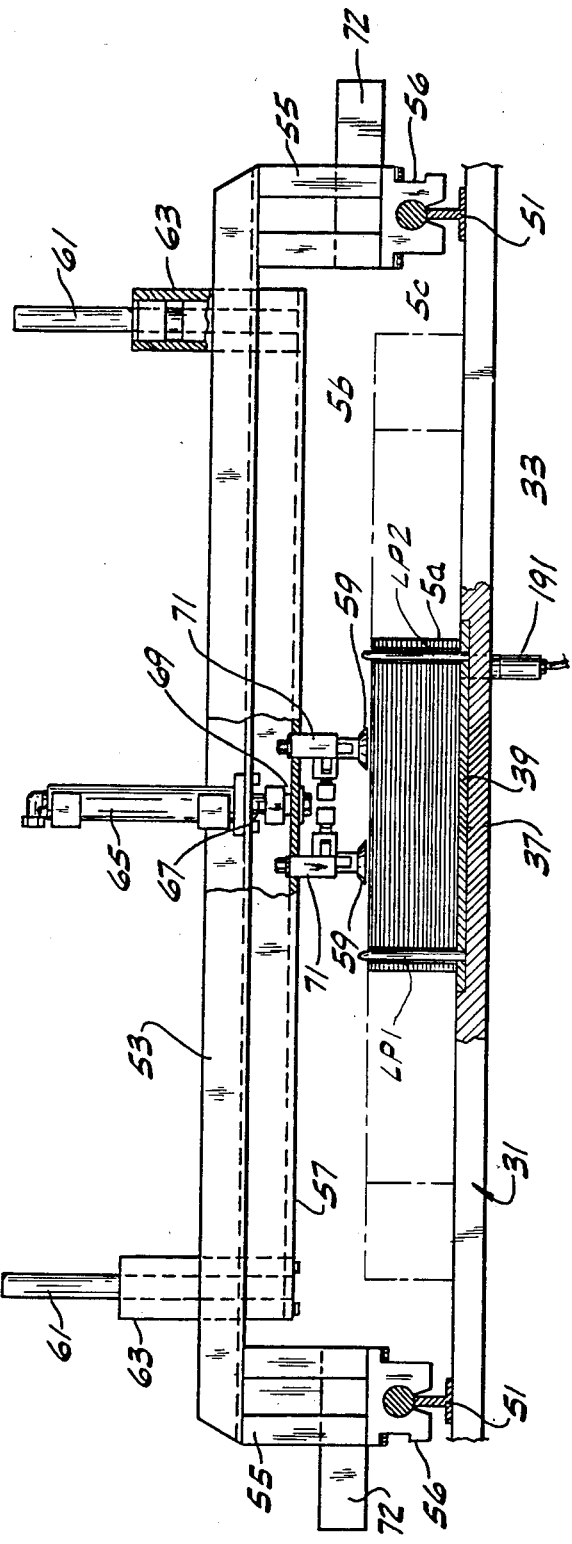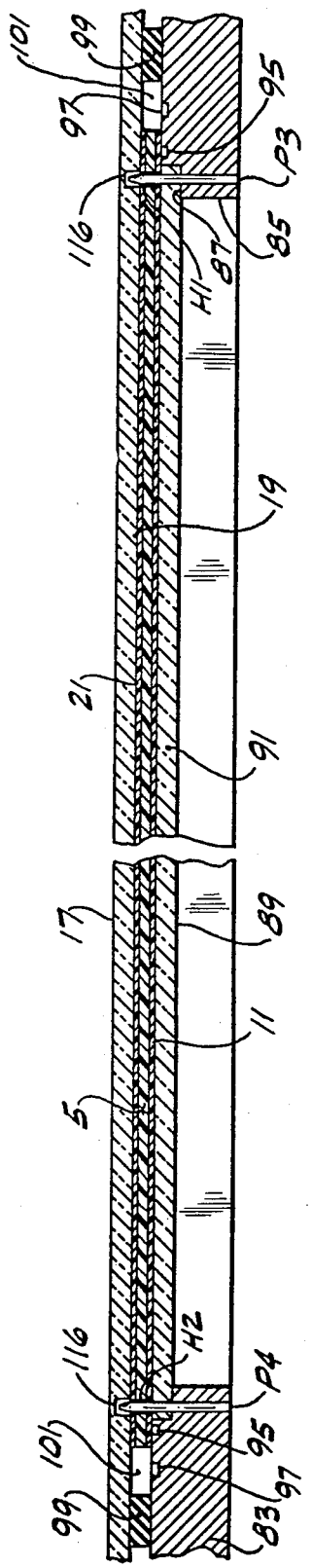

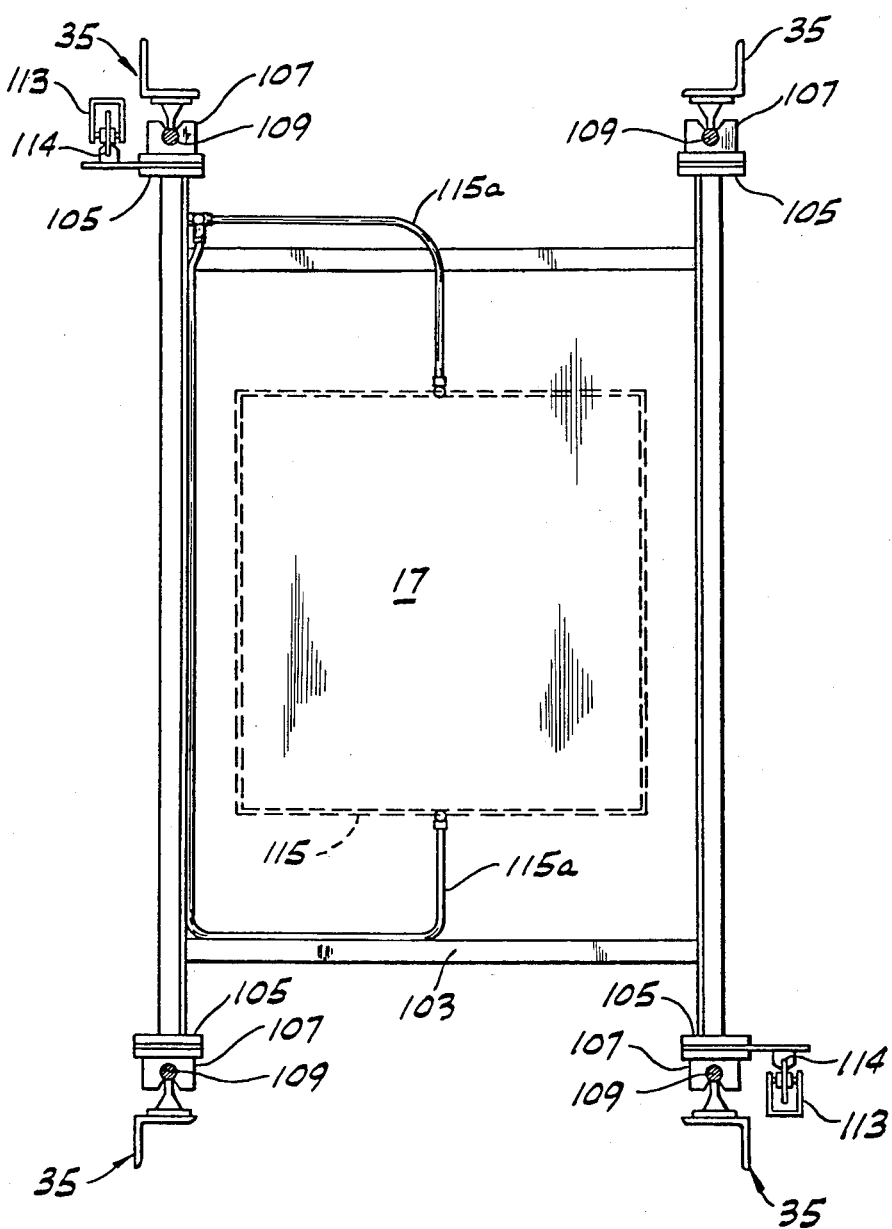

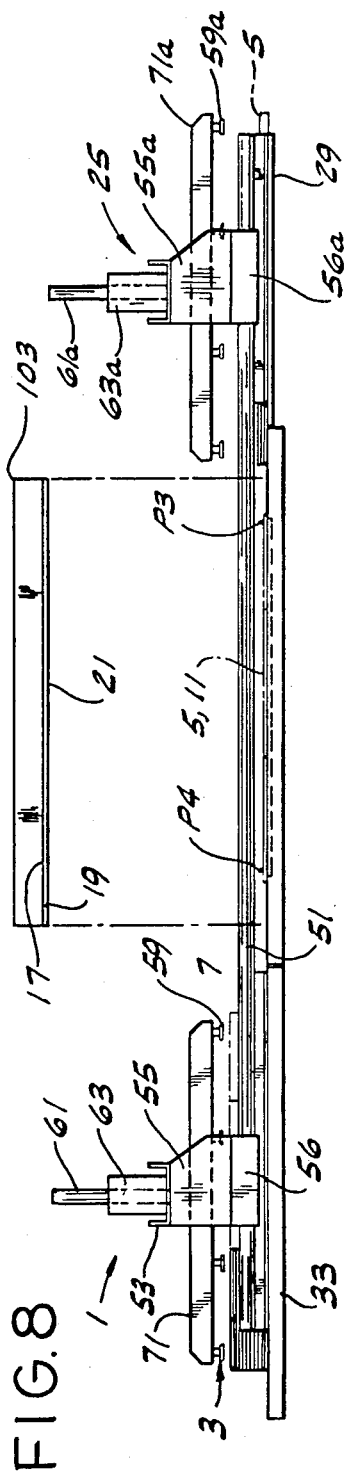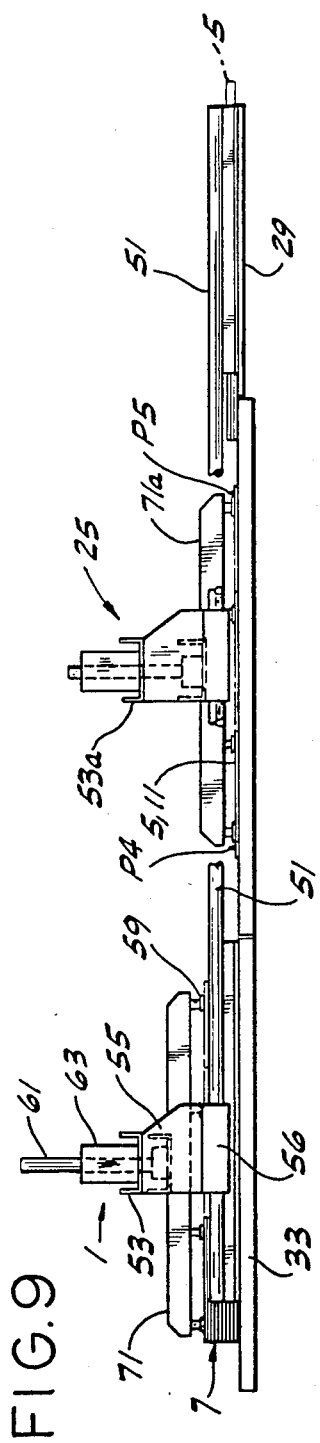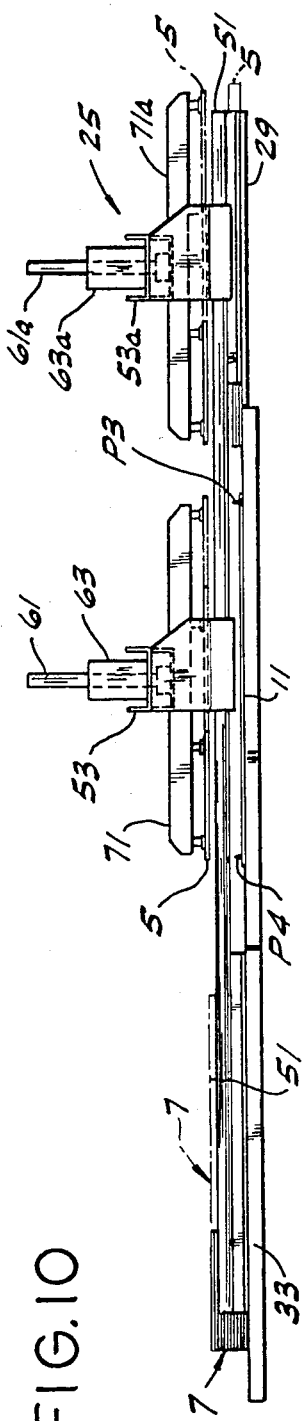

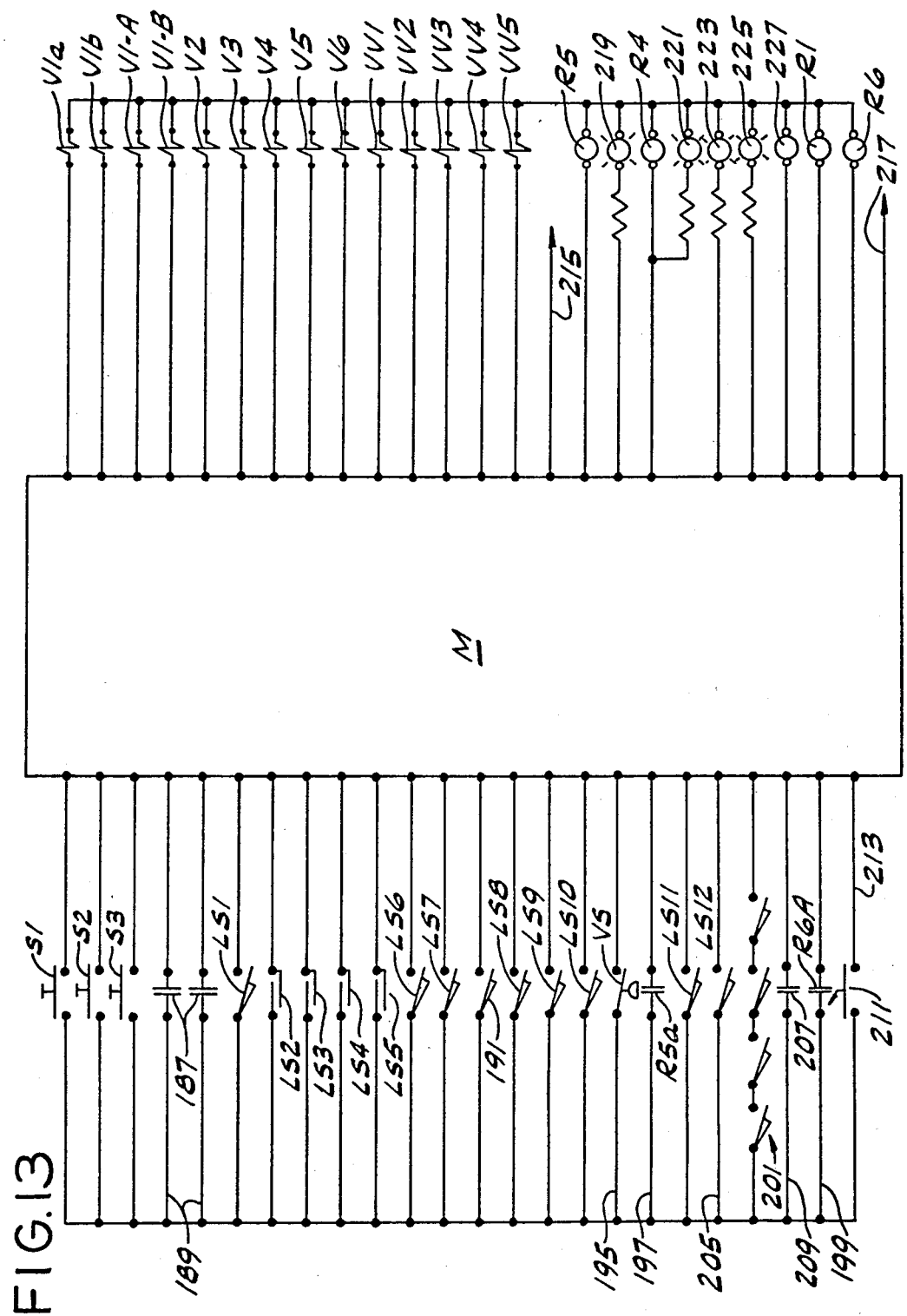

PHOTOGRAPHIC PRINTING

CROSS REFERENCE TO RELATED APPLICATION

This application is a continuation-in-part of the coassigned pending U.S. patent application Ser. No. 602,337 filed Apr. 20, 1984.

BACKGROUND OF THE INVENTION

This invention relates to photographic printing, and more particularly to apparatus for accurately aligning circuit boards, which are to be photographically printed, with films at the exposure station.

Reference may be made to the coassigned U.S. Pat. Nos. 3,635,559, 3,810,694 and 4,353,647 and U.S. patent application Ser. No. 362,515 filed Mar. 26, 1982 now U.S. Pat. No. 4,423,955 issued Jan. 3, 1984, for photographic printing methods and apparatus in the same general field.

SUMMARY OF THE INVENTION

Among the several objects of this invention may be noted the provision of a photographic printing apparatus of the same general type as disclosed in the above-noted patents and pending patent application particularly adapted for expeditiously handling a variety of sizes of circuit boards to be exposed for being photographically printed; the provision of such an apparatus for simultaneously exposing both sides of a circuit board to light through two films; and the provision of means for accurately aligning the circuit boards and films.

The apparatus comprises an exposure station at which a board is exposed to light through films on both sides, and preferably a loading magazine for holding in registered position a stack of boards to be exposed, for delivery to the exposure station. At the exposure station is a light-transmitting platen for holding thereon a lower film, a board on the lower film and an upper film on the board and a window movable from a raised position above the platen to a lowered position for engagement of the lower face of the window with the upper film for pressing the upper film, the board and the lower film together against the platen. Associated with the platen is adjustable means for positioning a board of any one of a variety of sizes to be exposed, in register with the upper and lower films. It preferably includes at least one pair of pins movable to various predetermined positions along one edge of the platen for providing maximum spacing between the pins for a given board size in order to more accurately register the board and the films. The window has means associated therewith for holding the upper film on its lower face. Means operable with the window raised delivers a board from the stack to the exposure station and applies it to a lower film on the platen in its registered position. Means is provided for exposing the board at the exposure station to light through the two films. Means operable with the window raised removes the exposed board from the exposure station while retaining the lower film on the platen and the upper film on the lower face of the window.

Other objects and features will be in part apparent and in part pointed out hereinafter.

BRIEF DESCRIPTION OF THE DRAWINGS

FIG. 5 is an enlarged section on line 5—5 of FIG. 2;

FIG. 6 is an enlarged section on line 6—6 of FIG. 2;

FIG. 7 is a plan view generally on line 7—7 of FIG. 1 showing the upper window at the exposure station of the apparatus;

FIG. 8 is view in side elevation on a larger scale than FIG. 1 showing both the delivery carriage and the discharge carriage of the apparatus in their home positions;

FIG. 9 is a view similar to FIG. 8 showing the discharge carriage moved from its home position to the exposure station;

FIG. 10 is a view similar to FIG. 8 showing the delivery carriage moved from its home position to the exposure station;

FIG. 13 is a second electrical circuit diagram.

Corresponding reference characters indicate corresponding parts throughout the several views of the drawings.

DESCRIPTION OF THE PREFERRED EMBODIMENT

Figure 1:
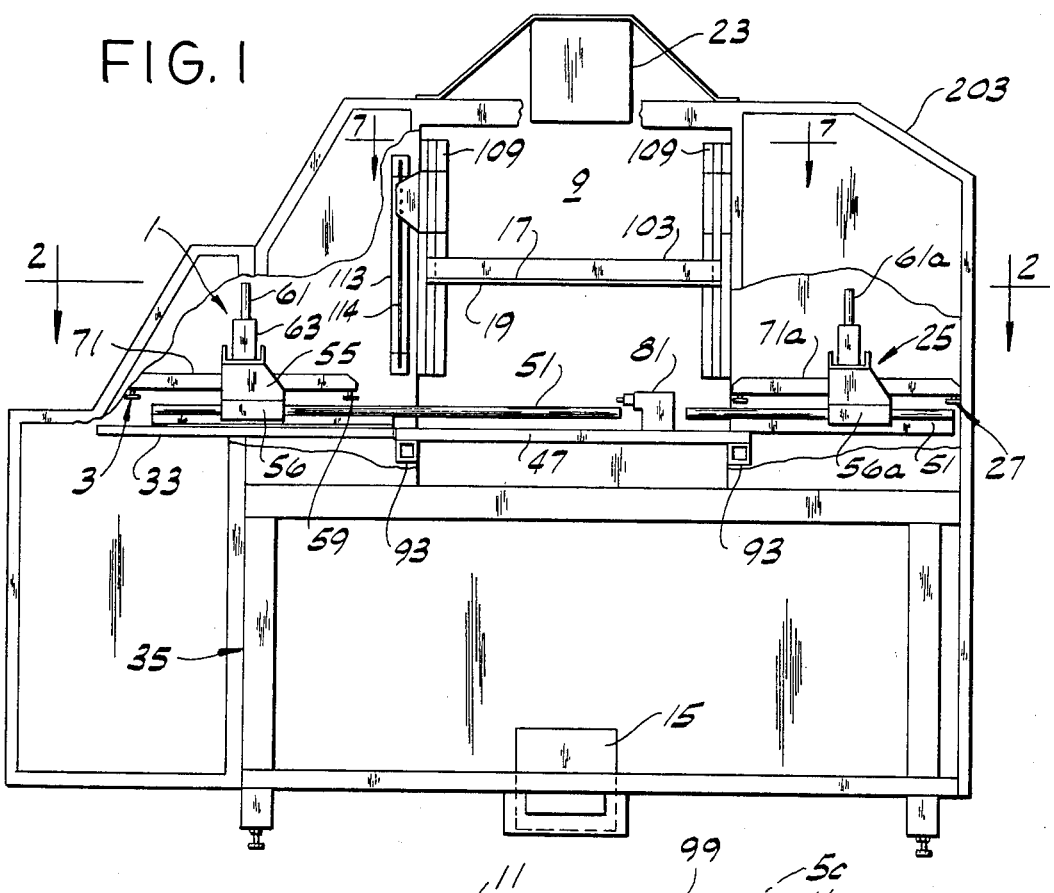
FIG. 1 is a side elevation of an apparatus of this invention, a housing of the apparatus being broken away.

The invention is herein described as it relates to exposing photosensitized boards which are to be processed into printed circuit boards. It will be understood that such a photosensitized board typically comprises a base of electrical insulation, generally a plastic material, having a layer of electrically conductive material, e.g., copper foil, on each side and a coating of photosensitive acid-resist material on each conductive layer, for being processed into what is called a double-side printed circuit board. In processing such a board photosensitized on both sides, for the production of printed circuits on both sides, each side thereof is exposed to light through a mask or film imaged in a circuit pattern according to the circuit to be provided on the respective side of the board, the exposed board being subsequently processed in a manner well known in the art including etching areas of the electrically conductive material to provide the requisite circuit pattern on each side of the board.

This invention involves apparatus for the double-side exposure of such boards. Referring to the drawings, the apparatus of this invention is shown to comprise a first carriage generally designated 1, which may be referred to as the infeed or delivery or loader carriage, having vacuum gripper means 3 for picking up a board 5, which is photosensitized on both sides and which is to be exposed on both sides, from a supply stack 7 of the boards 5, this carriage being moveable forward (toward the right as viewed in FIGS. 1, 2 and 8–10) to carry the picked-up board forward (downstream) to an exposure station 9 and deposit it in registration on a first film 11 (the "lower film") at the exposure station. This first or lower film 11 is manually placed and held in a fixed, predetermined registered position on a platen 13 at the exposure station, the board being deposited by the carriage 1 on this film and registered therewith, for exposure of the bottom side of the board through the film by energizing a light source 15 below the platen.

Above the platen 13 is an upper light-transmitting panel or window 17 adapted (as will be made clear) to hold on its bottom face 19 in registered position a second film 21 (the "upper film") through which the top side of the board is to be exposed. This upper window 17, carrying the upper film 21, is movable downwardly from a raised retracted position spaced a sufficient distance from the platen 13 for entry of the carriage 1 carrying a board 5 between the window and the platen to a lowered exposure position for pressing the upper film 21 (gripped to the bottom face 19 of the window 17), the board 5 and the lower film 11 thereunder down against the platen. Above the upper window is a light source 23 for exposing the upper side of the board to light through the upper window 17 and the upper film 21. A second carriage 25, which may be referred to as the outfeed or discharge or unloader carriage, has vacuum gripper means 27 for gripping the board 5 which has been exposed on both sides at the exposure station, and is movable between a retracted or "home" position forward of (downstream from) the exposure station back over the board at the exposure station, the upper window 17 being open, and then, having picked up the exposed board, is movable forward out of the exposure station to remove the exposed board and deliver it to receiving means 29 forward of the exposure station.

The apparatus comprises means indicated generally at 31 at what may be called the stack loading magazine for holding stack 7 of the photosensitized boards 5 to be exposed. The boards are all held by a single pair of loading pins LP1 and LP2 mounted a fixed distance apart at the stack loading magazine 31 and which are spaced closely enough together to receive the shortest (along that edge) of the boards 5. The pins LP1 and LP2 facilitate alignment of the boards at the loading magazine for subsequent delivery to the exposure station where they will be placed in registry with the films 11 and 21. The boards are rectangular, but can be of various sizes, as illustrated in FIG. 2A, although it is contemplated that all the boards 5 in a given stack 7 will normally be the same size. The sizes of the boards are generally standardized, for example, a smaller board 5A may be approximately 8×10 inches, a larger board 5B, 18×24 inches and a still larger board 5C, 24×30 inches.

In order to obtain maximum alignments of each of these boards 5 with the films 11 and 21 when in the exposure station, it is preferable to have the means for holding them in register at the exposure station, grip the boards as far apart as possible. In its preferred form, the invention comprises at least a pair of registration pins RP1 and RP2 which are positionable in any of a plurality of corresponding receiving holes H1-H8 drilled in platen 13 so that the pins RP1 and RP2 may be positioned at the maximum separation for each of a variety of sizes of boards 5a-c. Corresponding holes are formed in the boards at the maximum reasonable separation between the pins for the size of board being exposed. Thus, as shown in FIG. 2A, the pins RP1 and RP2 for the exemplary size of board 8×10 inches may be positioned in the corresponding receiving holes H4 and H5, for the 18×24 inch board in holes H2 and H7 and in the 24×30 inch board 5C, in holes H1 and H8. Each of the films 11 and 21 have corresponding holes H1 through H8 for aligning the film and boards in registry.

Means 31 comprises a table 33 formed by a rectangular table top plate mounted in horizontal position on the frame 35 of the apparatus at a convenient height for placement of the stack of boards on the table by an operator standing at the rearward or entry (upstream) end of the apparatus. The platen 13 is mounted on the frame 35 forward of the table 33 with its upper surface generally flush with the upper surface of the table.

The table 33 has a groove 37 in the top extending generally centrally thereof longitudinally of the apparatus. This groove receives a board stack magazine plate 39 having a pair of registration pins LP1 and LP2 adjacent one edge constituting its trailing end adapted for reception in the registration holes H4 and H5 of the boards 5 to hold them in a registered position relative to the magazine plate. The magazine plate is adapted for placement thereon of a stack 7 of boards 5 while removed from the table 33, and for placement with the stack thereon in the groove 37 in the table, thereby expediting placement of stacks on the table. The magazine plate is adapted to be secured in registered position in the groove with the boards registered by pins LP1 and LP2 relative to the apparatus, by means of thumbwheel screws 45 adapted to be threaded down into tapped holes in the table.

The frame 35 of the apparatus has horizontal rail supports 47 extending forward from the forward edge of the table 33 at table top level along both sides of the platen 13 and extending forward beyond the forward edge of the platen 13 on opposite sides of a forward table structure constituting the exposed board receiving means 29 which spans the frame forward of the platen 13. Guide rails 51 extend longitudinally of the apparatus adjacent its left and right sides on the table 33 and the rail supports 47, these rails extending forward from the table 33 on opposite sides of the platen 13 and the forward table 29.

The carriage 1 comprises an elongate channel-section bridge member 53 mounted at its ends on supports 55 on guide bushings 56 slideable on the left and right side guide rails 51, the bridge member 53 extending transversely of the apparatus at an elevation above the table 33. Vacuum gripper means 3 comprises a crossbar 57 carrying downwardly facing vacuum suction cups 59 movable up and down below the bridge member 53 for picking up the top board of the stack 7. The crossbar is mounted for up and down movement by means of guide rods 61 extending up from the crossbar adjacent its ends through holes in the bridge member 53 and through ball bushings 63 mounted on the bridge member, and is adapted to be driven up and down by means of an air cylinder 65 mounted on the bridge member at the center of its length, the piston rod 67 of the air cylinder extending down through a hole in the bridge member to a connection at 69 with the crossbar. The latter carries two vacuum cup bars each designated 71 extending at right angles thereto, i.e., longitudinally of the apparatus, forward and rearward of the crossbar, the vacuum cups 59 being mounted at intervals along the length of these vacuum cup bars.

Figure 2B:
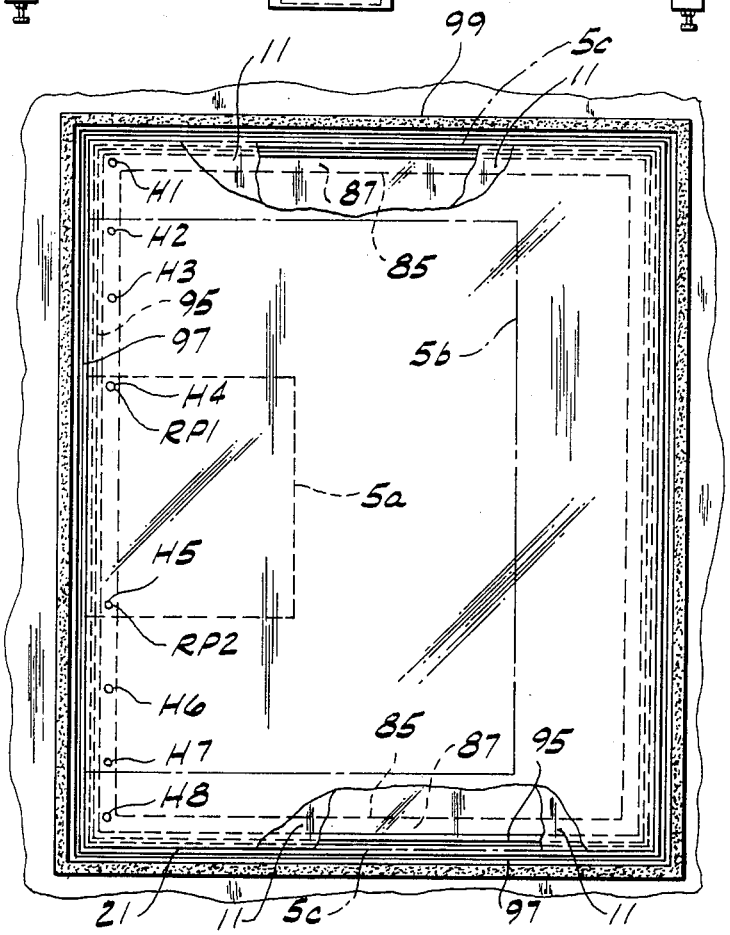
FIG. 2 is a plan of the apparatus with parts broken away, the view being generally on line 2—2 of FIG. 1.
FIG. 2A is an enlarged fragment of FIG. 2, with parts broken away.
Figure 2A:
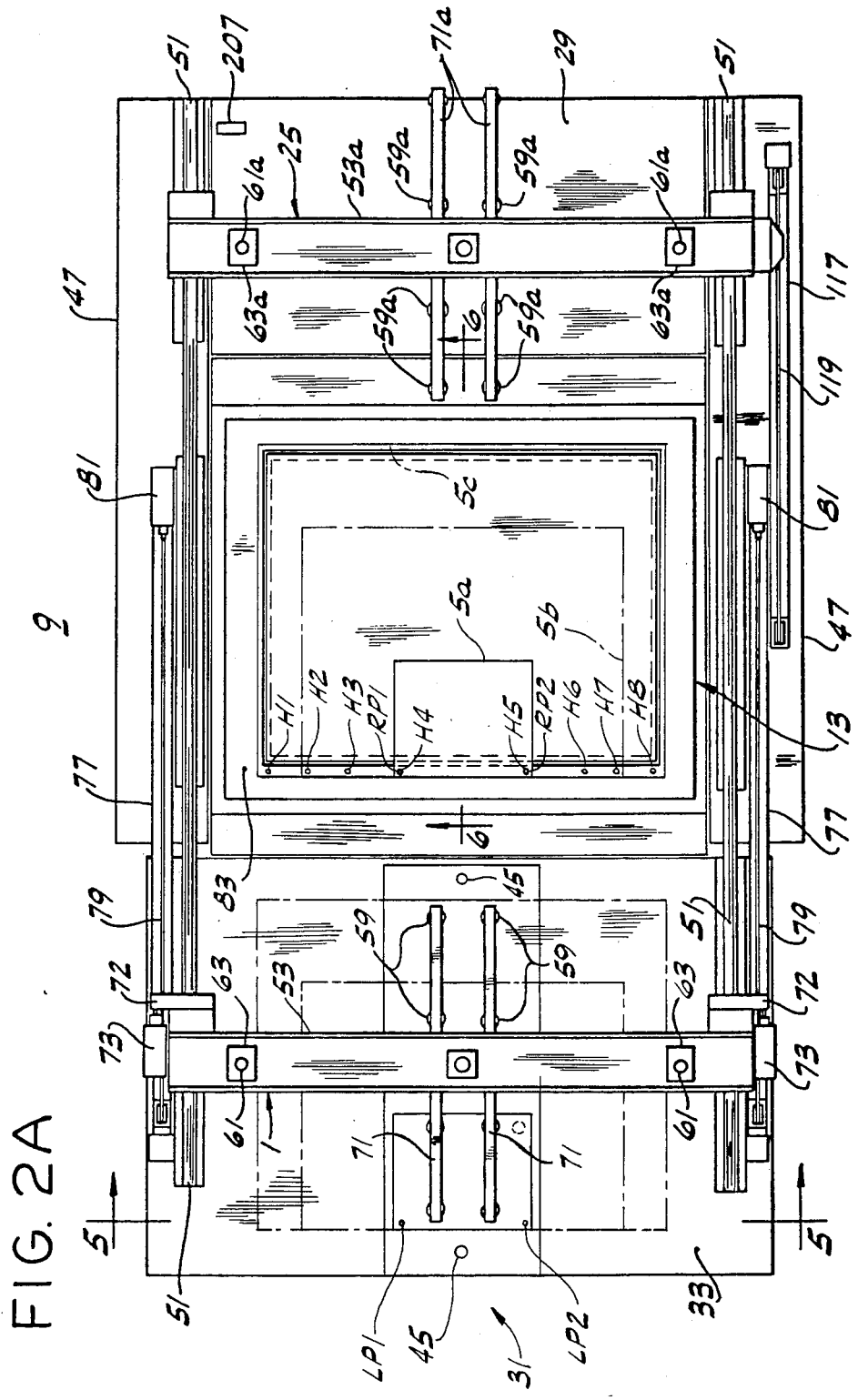

The carriage 1 is movable forward from the retracted board pickup or "home" position over the stack in which it is shown in FIGS. 1, 2, 8 and 9, determined by engagement of lugs 72 on the carriage with stops 73, to the exposure station 9 and rearward back to its retracted position by means indicated generally at 75 and comprising a pair of air-operated cable cylinders each designated 77, one at the left and the other at the right, the cables 79 of these cylinders being suitably attached to the carriage (see FIG. 2). These cylinders are operable to move the carriage forward to what may be called its board registration position in the exposure station illustrated in FIG. 10, determined by engagement of the carriage lugs with a pair of stops each designated 81, one at the left and the other at the right. In the board registration position, a board 5 gripped by the vacuum cups 59 of the carriage has its appropriate pair of registration holes H1–H8, as the case may be, aligned with registration pins RP1 and RP2 extending up from the platen 13.

The platen 13 comprises a relatively thick rectangular metal (aluminum) plate 83 having a rectangular window opening 85 therein with a groove or rabbet 87 all around the opening at the top. Set into the opening 85 and bearing on the shoulder 89 at the bottom of the rabbet is a transparent light-transmitting window pane 91, e.g. a transparent glass pane. The plate 83, which in effect constitutes a window frame for the window pane 91, is mounted at its forward and rearward ends on crossbeams 93 of the frame of the apparatus, spanning these beams, the arrangement being such as to allow for projection of light from the light source 15 up through the window pane 91. Plate 83 has two vacuum grooves 95 and 97 in the top extending all around the window pane 91. Groove 95 is the inner and 97 the outer of these grooves. Surrounding the outer groove 97 is a compressible seal 99 constituted, for example, by a strip of suitable rubber, engageable by the upper window 17 when it is lowered. The inner vacuum groove 95 is for vacuum-gripping the lower film 11 on the platen 13. The outer vacuum groove 97 is for drawing a vacuum in the space 101 between the upper window 17 and the platen 13 when the upper window is moved down into engagement with the seal to force the window, with upper film 21 held on its bottom face 19 as will appear, down into pressurized engagement with the board 5 and the lower film 11 and on the platen, the seal being compressed as this occurs.

Figure 3:
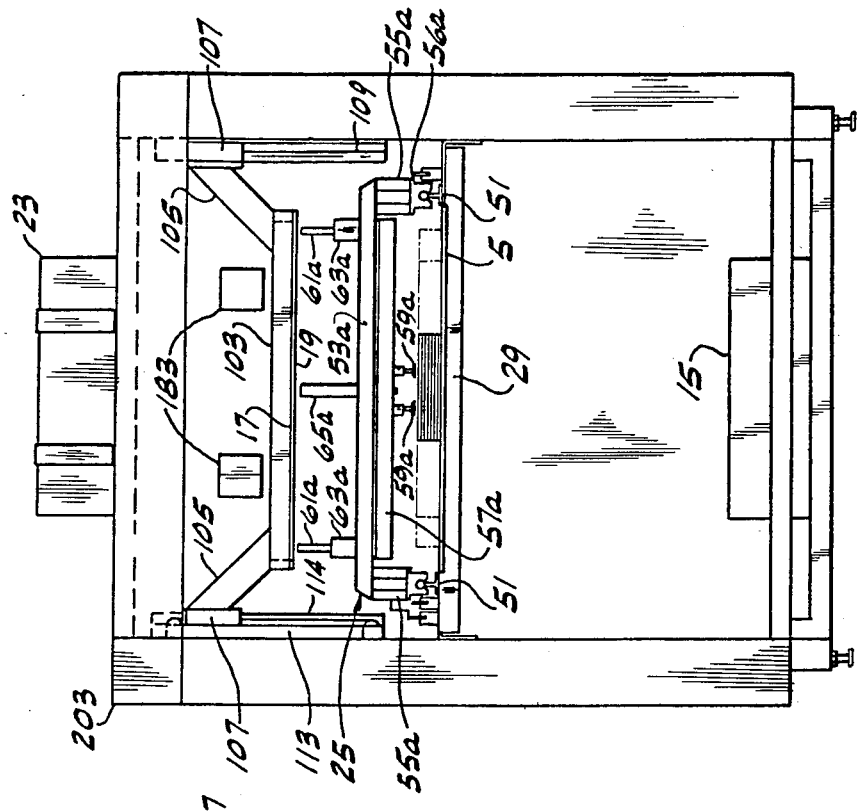
FIG. 3 is an end elevation of the apparatus as viewed from the left end of FIG. 1, with parts broken away.
Figure 4:
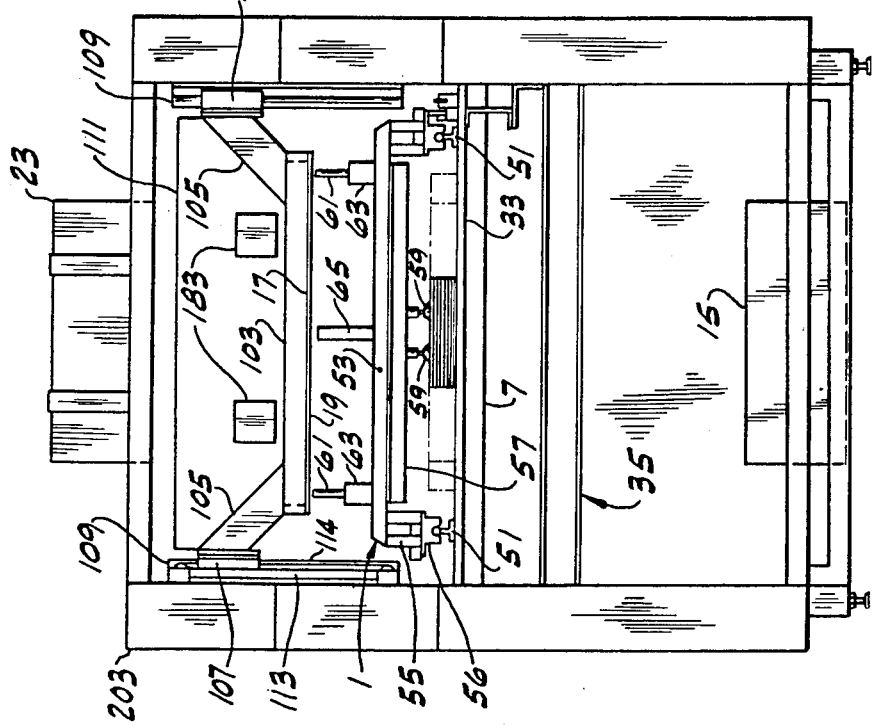
FIG. 4 is an end elevation as viewed from the right end of FIG. 1, with parts broken away.

At the exposure station 9, forward of (downstream from) the stack holding means or station 31, the upper window 17 (e.g. of transparent plastic) is movable downwardly toward and upwardly away from the platen 13, being mounted in horizontal position on the bottom of an open rectangular window frame 103 having corner brackets 105 carrying guide bushings 107 slideable on vertical rails 109 mounted on the frame 35 of the apparatus above the four corners of the platen 13. Suitable light shielding may be provided as indicated at 111 in FIG. 3. The window frame 103 carrying window 17 is movable up and down by means of a pair of air-operated cable cylinders each designated 113 at two diagonally opposite corners of the window frame, the cables 114 of these cylinders being attached to the guide bushings 107 at the respective corners. For gripping the upper film 21 on its lower face 19, the window 7 has a set of vacuum grooves 115 in its lower face, flexible vacuum lines 115a being connected thereto for drawing a vacuum in this set of grooves. It also has a plurality of pockets indicated at 116 in FIG. 6, equal to the number of holes H1–H8 for receiving the upper ends of the registration pins RP1 and RP2 in any of their positions when it is lowered.

The second carriage 25 is essentially identical to the first carriage 1, its parts being designated by the same numerals as applied to the parts of the carriage 1 with the suffix a. Its guide bushings 56a are slideable on rails 51 (like the guide bushings 56 of carriage 1). It is movable rearward from its forward or home position forward of the exposure station 9 in which it is illustrated in FIGS. 1, 2 and 8, when the upper window 17 is raised, to the rearward board pickup position in which it is illustrated in FIG. 9 between the platen 13 and the raised window 17, and forward back to its home position, by means shown as comprising an air-operated cable cylinder 117, the cable 119 of this cylinder being suitably attached thereto (see FIG. 2).

Figure 11:
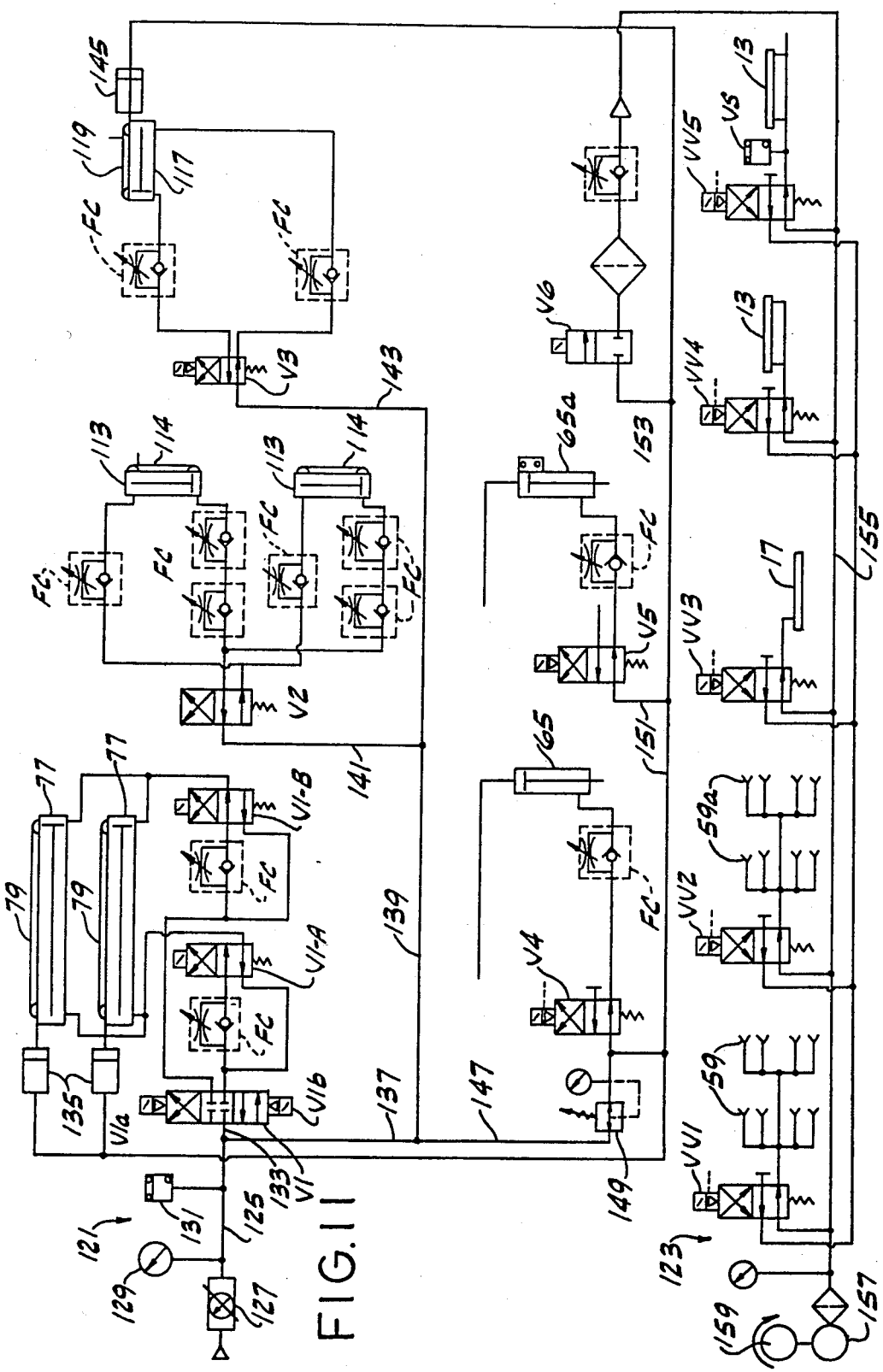
FIG. 11 is a diagram of the pneumatic (compressed air and vacuum) circuitry of the apparatus.

The apparatus has an air system 121 and a vacuum system 123 as shown in FIG. 11, the air system having a line 125 for supplying compressed air to the apparatus including a pressure regulator 127, a pressure gauge 129 and a pressure switch 131. Line 125 feeds a line 133 including a solenoid valve VI controlling a pneumatic circuit including solenoid deceleration valves VI-A and VI-B for the two delivery carriage cylinders 77. Flow controls are indicated at FC. Tension cylinders for tensioning the cables 79 of cylinders 77 are indicated at 135. Valve VI, as indicated in FIG. 11 has two coils VIa and VIb and the system is such that when VIb is energized, the delivery carriage 1 is moved rearward to its retracted or pickup position of FIGS. 1, 2, 8 and 9 (its home position) and when VIa is energized, the delivery carriage is moved forward. Valve VI-A acts to decelerate the carriage as it approaches its forward board registration position at the exposure station 9, and valve V1-B acts to decelerate the carriage toward the end of its return to its pickup or home position.

Line 125 feeds lines 137 and 139 and a line 141 feeding a solenoid valve V2 controlling a pneumatic circuit for cylinders 113 for raising and lowering the upper window 17, the window being raised when the valve V2 is deenergized and lowered when it is energized.

Line 139 also feeds a line 143 feeding a solenoid valve V3 controlling the discharge carriage cylinder 117. A tension cylinder 145 for the cable 119 of cylinder 117 is indicated at 145. When valve V3 is deenergized, the discharge carriage 25 is moved to its forward (home) position of FIGS. 1, 2, 8 and 10, and when it is energized the carriage moves to its rearward position at the exposure station 9.

Line 137 feeds a line 147 which includes a pressure regulator 149 for feeding a solenoid valve V4 controlling the cylinder 65 for raising and lowering the vacuum cups 59 of the delivery carriage 1. When valve V4 is deenergized, these cups are moved up and vice versa.

Line 147 via regulator 149 feeds a line 151 connected to a solenoid valve V5 for raising and lowering the vacuum cups 59a of the discharge carriage 25. When valve V5 is deenergized, these cups are moved up and vice versa.

The air system 121 is interconnected via a circuit indicated at 153 including a solenoid valve V6 with the vacuum system 123 for the purpose of quickly relieving vacuum in the vacuum system.

The vacuum system 123 has a vacuum line 155, in which a vacuum is drawn by a vacuum pump 157 driven by a motor 159, interconnected with vacuum solenoid valves VV1VV5. Valve VV1 controls vacuum for the loader carriage cups 59. Valve VV2 controls vacuum for the unloader carriage cups 59a. Valve VV3 controls vacuum for the vacuum groove 115 in the bottom of the window 17. Valve VV4 controls vacuum for the film-grip vacuum groove 95 in the platen 13. And valve VV5 controls vacuum for the vacuum groove 97 in the platen, the system here including a vacuum switch VS.

Figure 12A:
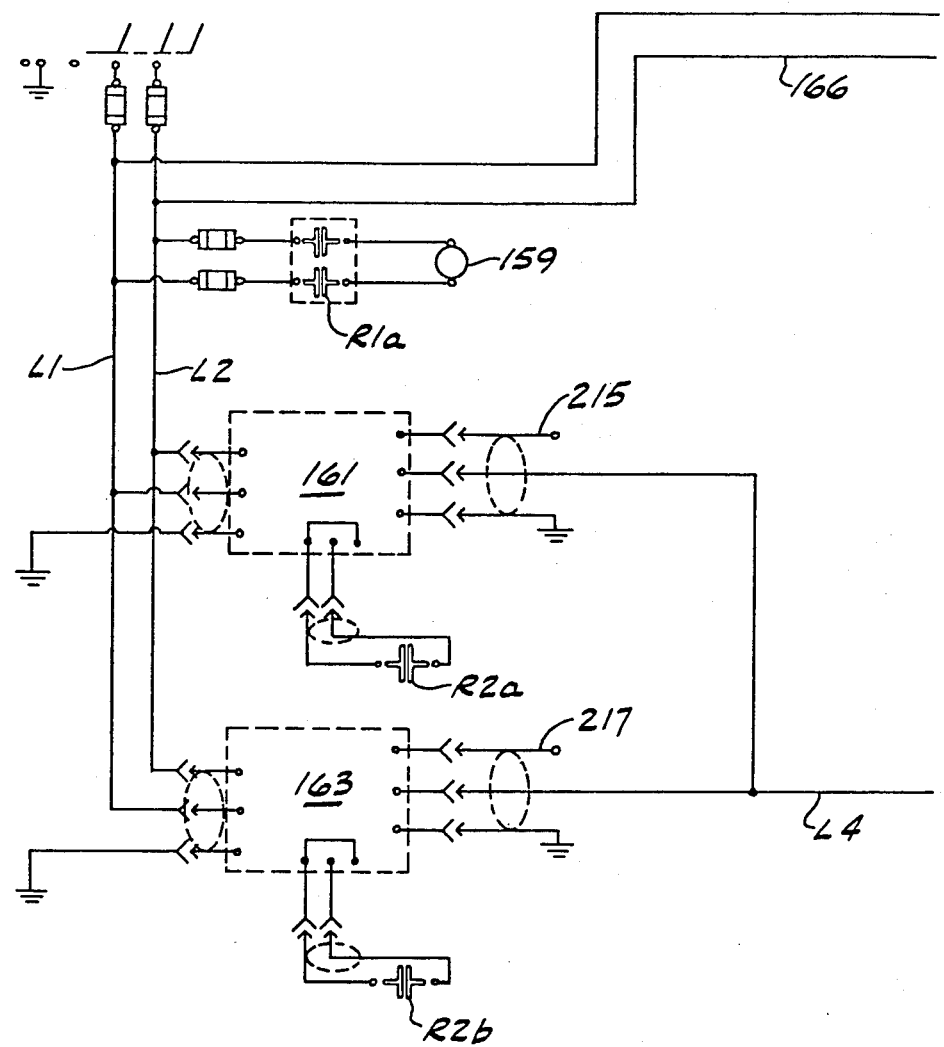
FIGS. 12A and 12B together constitute a first electrical circuit diagram.
Figure 12B:
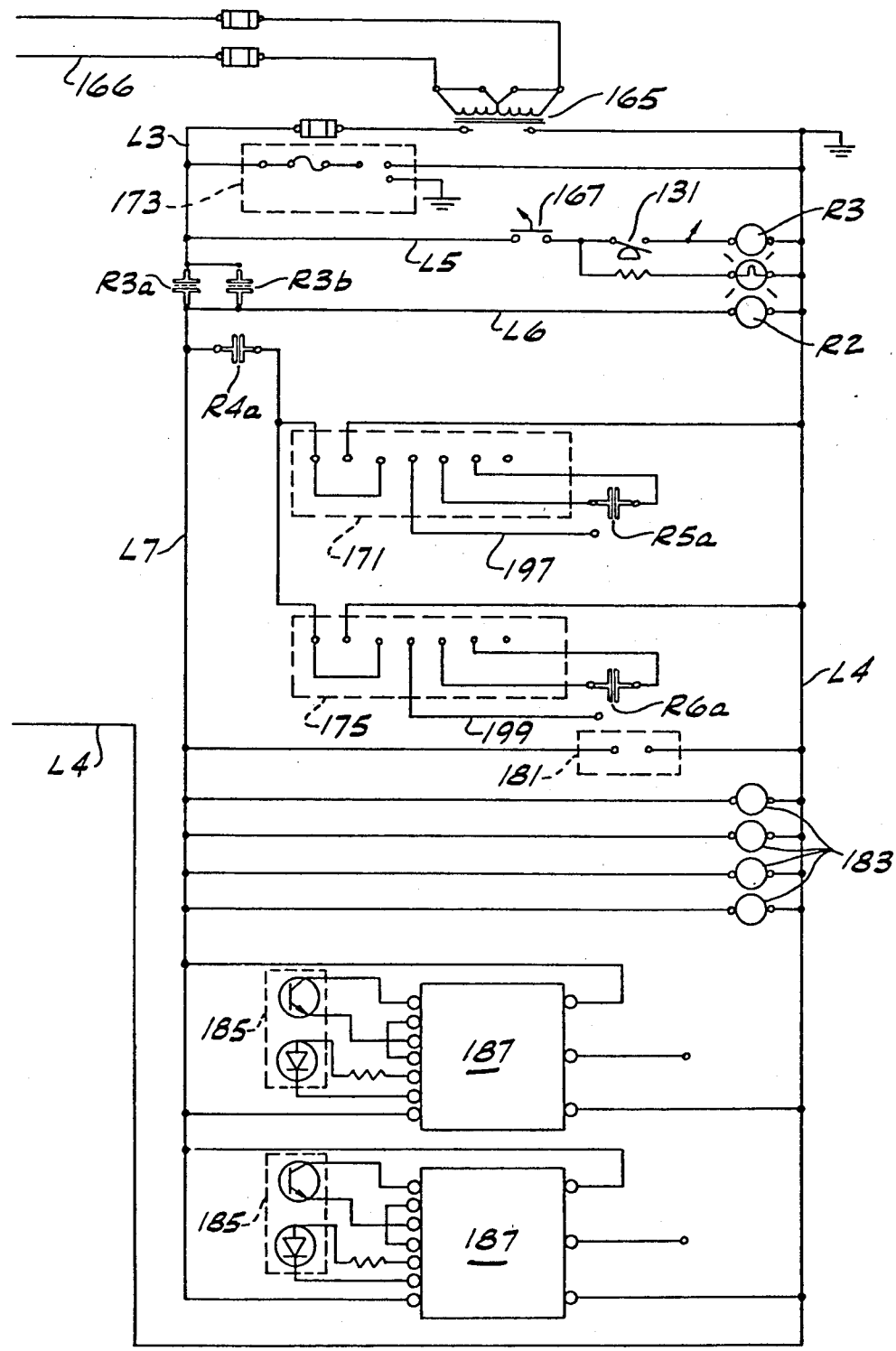

Referring to FIGS. 12A and 12B, main power supply lines for the apparatus are indicated at L1 and L2. The motor 159 (FIG. 13) for driving the vacuum pump 157 is connected across these lines under control of contacts R1a of a relay R1 (FIG. 12B). Power supply systems 161 and 163 for the upper and lower lamps 23 and 15 are powered via lines L1 and L2, under control of contacts R2a and R2b of a relay R2. Lines L3 and L4 are connected to the secondary of a transformer 165 powered from lines L1 and L2 as indicated at 166. A control switch 167 (an on-off switch) is connected in series with pressure switch 131 and a control relay R3 in a line L5 across lines L3 and L4. Relay R2 is connected in a line L6 fed by contacts R3a and R3b. Contacts R3a when closed also feed a line L7. An integrator 171 for the upper lamp 23 is connected across lines L7 and L4 in a circuit including contacts R4a of relay (see FIG. 13). The upper lamp is turned on under control of integrator 171 on closure of contacts R5a of a relay R5 (FIG. 13). Similarly, an integrator 175 for the lower lamp 15 is connected across lines L7 and L4 in the circuit including contacts R4a. The lower lamp is turned on under control of integrator 175 on closure of contacts R6a of a relay R6 (see FIG. 13). These integrators are identical, each being of a standard commercially available type adapted on initiation of its operation to integrate light falling on it and to turn off the respective lamp power supply system 161, 163 for the respective lamp when the amount of light reaches a value (set by adjustment of the integrator) needed for proper exposure of the board. At 179 (FIG. 12B) is indicated a power supply system for a microcomputer M (FIG. 13) connected across lines L3 and L4. At 181 is indicated a wiring arm for the microcomputer connected across lines L7 and L4. Blowers such as indicated at 183 on the shielding on the upper window 17 are connected across lines L7 and L4. Photosensors such as indicated at 185 are provided for sensing the presence and correct registration of boards on platen 13 in the exposure station 9, control units 187 for these photosensors being connected across lines L7 and L4.

The microcomputer M is programmed for operation of the apparatus as hereinafter described. Manually operable (push button) switches S1, S2 and S3 and limit switches LS1-LS12 are connected in input lines to the microcomputer as illustrated. S1 is a start or "Process" switch. S2 is a stop ("Cancel") switch. S3 may be referred to as the "Load Plate" switch, being operable to drive carriage 1 forward from its retracted pickup or home position to clear the table 33 for applying magazine plate 39 with a stack 7 of boards 5 thereon to the table. LS1 is a delivery carriage pickup (home) position limit switch operable by the carriage 1 as, in moving rearward (upstream), it reaches its pickup (home) position. LS2 is an upper limit switch and LS3 is a down limit switch for the carriage 1 vacuum bars 71 carrying vacuum cups 59. LS4 and LS5 are up and down limit switches for the carriage 25 vacuum bars 71a carrying vacuum cups 59a. LS6 is a carriage 1 forward or exposure station registration position limit switch operable by carriage 1 as, in moving forward, it reaches that position. LS7 and LS8 are deceleration limit switches for effecting deceleration of carriage 1 as it approaches its home and exposure station registration positions, respectively. LS9 and LS10 are up and down limit switches for the upper window 17. LS11 and LS12 are exposure station and home position limit switches, respectively, for the carriage 25. The photosensor control units 187 are connected as indicated in FIG. 13 in input lines 189 to the microcomputer M. At 191 is indicated a sensor for sensing absence of boards at the stack-holding station connected in a microcomputer input line 193. Vacuum switch VS is connected in a microcomputer input line 195. Contacts R5a and R6a for the integrators 161 and 163 are connected in microcomputer input lines 197 and 199. Switches indicated at 201 are door interlock switches for doors of housing 203 of the apparatus, connected in microcomputer input line 205. A photosensor 207 for sensing discharge stack height is connected in a microcomputer input line 209. A one-side/two-side selection switch 211 is connected in a microcomputer input line 213.

Referring to FIG. 13, coils V1a and V1b of air valve V1, deceleration valves V1-A and V1-B, air valves V2-V6 and vacuum valves VV1-VV5 are all connected in output lines from the microcomputer M to line L4. Microcomputer output lines 215 and 217 are connected to the power supply systems 161 and 163 for the upper and lower lamps 23 and 15 for controlling the latter in response to the integration of light by the integrators 171 and 175. Relays R1, R4, R5 and R6 are connected in output lines from the microcomputer M to line L4. An "empty magazine" signal lamp 219, a "process" signal lamp 221, a "load position" signal lamp 223, a "full stack" signal lamp 225 and an "empty magazine/full stack" audible alarm signal 227 are connected in microcomputer output lines for operation as will appear.

Operation is as follows:

For the description of the operation of the apparatus, it will be assumed that at the start of the operation, there are no boards or films in the apparatus, the loader carriage 1 is back in its retracted board pickup or home position of FIGS. 1, 2 and 8 with its vacuum cups 59 raised, and the unloader carriage 25 is forward (downstream) in its discharge or home position of FIGS. 1, 2 and 8 with its vacuum cups 59a raised. The upper window 17 is raised.

Control switch 167 is turned on and, with air pressure in line 125 and pressure switch 131 thereby closed, relay R3 is energized and its contacts R3a and R3b are closed so that relay R2 is energized via line L6 and its contacts R2a and R2b are closed to turn on the lamp power systems 161 and 163, which are allowed time to warm up. With contacts R3a closed, a circuit for line L7 is completed.

The operator manually places a lower film 11 in registered position on the platen 13, registering it by means of platen pins RP1 and RP2, received in the corresponding pair of registration holes H1 ∝ H8 of the lower film, then places a first board 5 to be exposed in registered position on the lower film, registering the board by means of pins RP1 and RP2, received in the corresponding registration holes H1-H8 in the board, and then places an upper film 21 in registered position on top of the board, registering it by means of pins RP1 and RP2, received in the corresponding registration holes H1-H8 of the upper film. It will of course be understood that a sandwich consisting of a lower film, a board, and an upper film may be assembled and applied to the pins as a unit, rather than applying each separately to the pins. Photosensors 187 sense proper placement of the films and board on the platen.

Having placed the lower film 11, board 5 and upper film 21 on the pins RP1 and RP2 at the exposure station, the operator actuates the "Load Plate" switch S3, which results via the microcomputer M in energization of coil V1b for actuation of valve V1 to operate air cylinders 77 to drive carriage 1 forward to its forward position at the exposure station 9 corresponding to the position in which it is illustrated in FIG. 10, but without carrying a board 5, thus clearing the table 33 for application thereto of magazine plate 37 carrying a stack 7 of boards 5 to be processed, with the boards registered on the pins LP1 and LP2 extending up from the plate through the registration holes H4 and H5 in the boards. The plate 37, carrying the stack 7, is placed in the groove 37 in the top of the table and fastened in place (in registered position) by means of the thumbwheel screws 45. Sensor 191 thereupon senses the presence of boards in proper position at the stack-holding stations.

Now, with the lower film 11, board 5 and the upper film 21 in registered position on the platen 13 at the exposure station ready for exposing the board on both sides to light from lamps 15 and 23 through the films, and with the supply of boards 5 on table 33 at the stack-holding station, the operator actuates the start or "Process" switch S1, and the operation proceeds through the following steps:

1. Relay R1 is energized via the microcomputer M and its contacts R1a close to energize the vacuum pump motor 159 to draw vacuum in the vacuum system 123, and relay R4 is energized to supply power to the integrators 171 and 175.

2. Coil V1b of the valve V1 is energized via the microcomputer to actuate air cylinders 77 to return the carriage 1 to its board pickup position (its retracted or home position) of FIGS. 1, 2 and 8. As it approaches its pickup position, it actuates the deceleration limit switch LS7, energizing the decleration valve V1-B to slow the carriage down. The slowed-down carriage 3 is stopped at the pickup position by engagement of carriage lugs 72 with the stops 73, and as it reaches this position it actuates the limit switch LS1.

3. On actuation of limit switch LS1, valve V2 is energized via the microcomputer M, to actuate air cylinders 113 to lower the window 17, which moves down into engagement with the seal 99 and presses it down to seal off space 101. As the window comes down into engagement with the seal, it actuates limit switch LS10.

4. On actuation of limit switch LS10, vacuum valve VV5 is energized via the microcomputer to draw a vacuum in the space 101, the window 17 then being forced down by atmospheric pressure to squeeze down the film/board/film sandwich on the platen 13. Vacuum valves VV3 and VV4 are energized via the microcomputer to draw a vacuum in the vacuum groove 115 in the bottom face 19 of window 17 for gripping the upper film 21 on the bottom face of the window, and to draw a vacuum in the vacuum groove 95 in the platen 13 for gripping the lower film 11 down on the platen.

5. Vacuum is drawn in space 101 for a suitable interval (e.g. ten seconds) after reaching a suitable level (e.g. 25" Hg.) and vacuum switch VS is actuated to energize relays R5 and R6 via the microcomputer to close contacts R5a and R6a for energizing the upper and lower lamps 23 and 15 from the lamp power supply systems 161 and 163 under control of the integrators 171 and 175. With the lamps on, the lower face of the board 5 at the exposure station 9 is exposed to light through the platen window pane 91 and the lower film 11, and the upper face of the board is exposed to light through the upper window 17 and the upper film 21. Vacuum is continuously drawn during the exposure, the time of which is determined by the integrators 171 and 175, and which may be varied in accordance with the photosensitive acid-resist material on the board.

6. When the lamps 23 and 15 are extinguished, valve V6 is energized via the microcomputer to inject a short blast of air via groove 97 into the space 101 to release the upper window 17 to allow it to rise. Vacuum is maintained in groove 95 to grip the lower film 11 to the platen 13 and in groove 115 to grip the upper film 21 to the upper window 17.

7. On extinguishing the lamps and the injection of air into the space 101, valve V2 is deenergized with resultant actuation of air cylinders 113 to raise the window 16 with the upper film 21 vacuum-gripped to the bottom face 19 of the window. The lower film 11 remains gripped (by vacuum) to the platen 13, and the now-exposed board 5 remains on the lower film. As the window 17 reaches its upper position, it actuates limit switch LS9 and stops.

8. On actuation of limit switch LS9, valve V3 is energized via the microcomputer to actuate air cylinder 117 to drive the unloader carriage 25 rearward (upstream) to its board pickup position above the exposed board 5 in the exposure station 9, as shown in FIG. 9. AS it reaches the stated pickup position, it actuates limit switch LS11 and comes to a stop.

9. On actuation of limit switch LS11, valves V4 and V5 are energized via the microcomputer to actuate air cylinder 65 and 65a to drive down the vacuum cup bars 71 of the loader carriage 1 and the vacuum cup bars 71a of the unloader carriage 25. Bars 71 move down to bring the loader carriage vacuum cups 59 into engagement with the top board 5 of the stack 7 at the stack-holding station, and bars 71a move down to bring the unloader carriage vacuum cups 59a into engagement with the exposed board 5 at the exposure station 9. As the bars 71 move down, limit switch LS3 is tripped; as the bars 71a move down, limit switch LS5 is tripped.

10. On actuation of limit switch LS3, valve VV1 is energized via the microcomputer to draw vacuum in the loader vacuum cups 59 so that they vacuum grip the top board 5 of the stack 7 at the stack-holding station.

11. On actuation of limit switch LS5, valve VV2 is energized via the microcomputer to draw vacuum in the unloader vacuum cups 59a so that they vacuum grip the exposed board 5 at the exposure station.

12. Valves V4 and V5 are deenergized and vacuum cups 59 and 59a move up, lifting the board next to be exposed and the just-exposed board. When the cups are raised, limit switches LS2 and LS4 are tripped.

13. Coil V1a of valve V1 is energized via the microcomputer and valve V3 is deenergized to actuate air cylinders 77 to move the loader carriage 1 carrying the picked-up board 5 next to be exposed to the exposure station 9 and simultaneously to move the unloader carriage 25 carrying the just-exposed board 5 from the exposure station to the unloading station at 29. As the loader carriage 1 approaches its registration position at the exposure station (FIG. 10), it actuates the deceleration limit switch LS8, energizing the deceleration valve V1-A to slow the carriage down. The slowed-down carriage 1 is stopped at the registration position by engagement of the carriage lugs 72 with the stops 81, and as it reaches this position it actuates limit switch LS6. As the unloader carriage 25 reaches its retracted (home) position (shown in FIG. 10), it actuates limit switch LS12.

14. On actuation of limit switches LS6 and LS12, valves V4 and V5 are energized via the microcomputer to drive the vacuum bars 71 and 71a carrying vacuum cups 59 and 59a down. As the bars are moved down, limit switches LS3 and LS5 are actuated, resulting in deenergization of vacuum valves VV1 and VV2 to cut off vacuum in the vacuum cups to release the new board to be exposed in registered position on the pins RP1 and RP2 on top of the lower film 11 (which was left on the platen 13) and to release the exposed board on the table 29.

15. Valves V4 and V5 are then deenergized, and vacuum bars 71 and 71a return to their raised position, with resultant tripping of limit switches LS2 and LS4.

16. Coil V1b of valve V1 is energized via the microcomputer to actuate air cylinders 79 to return carriage 1 to its pickup position (FIGS. 1, 2 and 8) as in step 1. The unloader carriage 25 remains in its home position.

This completes a first cycle of operation of the apparatus. The lower film 11 remains in registered positon on the platen 13 (registered by means of the pins RP1 and RP2). A fresh board to be exposed is in registered position (registered by means of the pins RP1 and RP2) on the lower film. The window 17, now in raised position, carries gripped to its bottom face 19 (gripped by vacuum in groove 115) the upper film 21, the latter being in registered position relative to the board 5, the lower film 11 and the pins RP1 and RP2 at the exposure station 9 by reason of having been previously registered on the pins, and picked up by window 17 without disturbing its registration.

The apparatus continues in operation in cycles involving steps 3–16 as above described until the supply of boards 5 to be exposed (stack 7) is exhausted or until the stack of exposed boards on table 29 reaches a predetermined height (e.g. three inches). Exhaust of the supply is sensed by the sensor 191. When it senses this, it acts via the microcomputer to cut off further cycling of the apparatus until the supply is replenished. It also acts via the microcomputer to energize the empty magazine signal lamp 219 and alarm 227. Sensors 185 act to cut off operation of the apparatus if there is no board at the exposure station or if it is not properly registered. Sensor 207 acts via the microcomputer to cut off operation of the apparatus when the output stack of exposed boards on table 29 reaches a predetermined maximum height (e.g., three inches) and acts to energize the "full stack" signal lamp 225 and the alarm 227.

In view of the above, it will be seen that the several objects of the invention are achieved and other advantageous results attained.

As various changes could be made in the above constructions and methods without departing from the scope of the invention, it is intended that all matter contained in the above description or shown in the accompanying drawings shall be interpreted as illustrative and not in a limiting sense.

What is claimed is:

1. Apparatus for exposing boards which are photosensitized on both sides, for production of printed circuits on both sides, to light through films on both sides, each film being imaged in a circuit pattern, said apparatus comprising:

an exposure station at which a board is exposed to light through films on both sides,
a light-transmitting platen at the exposure station for holding thereon a lower film, a board on the lower film and an upper film on the board,
registration means being variably positionable at the exposure station adjacent the platen for holding any one of a variety of sizes of boards along an edge thereof in registry with the upper and lower films during exposure, and
a window movable from a raised position above the platen to a lowered position for engagement of the lower face of the window with the upper film for pressing the upper film, the board and the lower film together against the platen,
means for exposing the board at the exposure station to light through the two films.

2. Apparatus as defined in claim 1 wherein the registration means includes a pair of registration pins adjustably disposable in fixed positions along an edge of the platen and the adjacent edge of the board to be exposed.

3. Apparatus as defined in claim 2 wherein the pins are positionable in spaced relation such that they fit in corresponding holes in the boards which are closely adjacent the ends of the board along the edge of the platen adjacent which they are positioned in the exposure station.

4. Apparatus as defined in claim 3 including: means defined in the platen for receiving and holding the registration pins in predetermined positions.

5. Apparatus as defined in claim 1 including:
a loading magazine disposed adjacent the exposure station,
means on said magazine for holding a stack of boards for individual delivery to the exposure station;
said window having means associated therewith for holding said upper film on its lower face,
means operable with the window raised and holding the upper film for delivering a board from the stack to the exposure station and applying it to a lower film on said platen in engagement with the registration means so that the board is in registry.

6. Apparatus as defined in claim 5 including further registration means disposed at the loading magazine for aligning the boards so that they are juxtaposed with their position in the exposure station.

7. Apparatus as defined in claim 6 including loading pins at the magazine for holding the stack of boards with corresponding holes therein along the same edge thereof as the holes for the registration pins.

8. Apparatus as defined in claim 7 wherein the loading pins are spaced the same as or lesser distance than the spacing of the registration pins.

9. Apparatus as defined in claim 2 including:
a loading magazine disposed adjacent the exposure station,
means on said magazine for holding a stack of boards for individual delivery to the exposure station;
said window having means associated therewith for holding said upper film on its lower face,
means operable with the window raised and holding the upper film for delivering a board from the stack to the exposure station and applying it to a lower film on said platen in engagement with the registration means so that the board is in registry.

* * * * *